United States Patent
Aurongzeb et al.

(10) Patent No.: US 10,737,467 B2
(45) Date of Patent: Aug. 11, 2020

(54) MULTILAYER GLASS COMPOSITE DISPLAY COVER

(71) Applicants: Deeder M. Aurongzeb, Austin, TX (US); Stefan Peana, Austin, TX (US)

(72) Inventors: Deeder M. Aurongzeb, Austin, TX (US); Stefan Peana, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 773 days.

(21) Appl. No.: 14/467,664

(22) Filed: Aug. 25, 2014

(65) Prior Publication Data

US 2016/0057877 A1  Feb. 25, 2016

(51) Int. Cl.
| | |
|---|---|
| *H05K 5/03* | (2006.01) |
| *B32B 17/06* | (2006.01) |
| *B32B 37/00* | (2006.01) |
| *B32B 37/06* | (2006.01) |
| *B32B 37/10* | (2006.01) |
| *B32B 37/24* | (2006.01) |
| *B32B 38/08* | (2006.01) |

(52) U.S. Cl.
CPC ........ *B32B 17/06* (2013.01); *B32B 2037/243* (2013.01); *B32B 2037/246* (2013.01); *B32B 2250/05* (2013.01); *B32B 2264/107* (2013.01); *B32B 2307/412* (2013.01); *B32B 2315/08* (2013.01); *B32B 2367/00* (2013.01); *B32B 2457/20* (2013.01); *B32B 2551/00* (2013.01)

(58) Field of Classification Search
CPC ....... B32B 17/064; B32B 17/06; B32B 17/10; B32B 17/10009; B32B 17/10027; B32B 17/10137; B32B 17/1055; B32B 27/06; B32B 2205/05; B32B 27/42; B32B 27/2264; B32B 27/107; B32B 2037/243; B32B 2037/246; B32B 2037/412; B32B 2037/2367; B32B 2037/00; B32B 2551/00; B32B 2250/05; B32B 2315/08; B32B 2457/20

See application file for complete search history.

(56) References Cited

U.S. PATENT DOCUMENTS

| | | | |
|---|---|---|---|
| 5,674,790 A | 10/1997 | Araujo | |
| 7,558,054 B1 * | 7/2009 | Prest | .......... H05K 5/0239 361/679.3 |
| 2003/0077453 A1 * | 4/2003 | Oaku | .......... B32B 17/10036 428/415 |
| 2007/0003746 A1 * | 1/2007 | Chen | ............ B32B 17/10 428/220 |
| 2009/0142568 A1 | 6/2009 | Dejneka et al. | |
| 2009/0215607 A1 | 8/2009 | Dejneka et al. | |
| 2009/0220761 A1 | 9/2009 | Dejneka et al. | |

(Continued)

FOREIGN PATENT DOCUMENTS

WO  WO-2005110741 A1 * 11/2005 ........... B32B 17/064

*Primary Examiner* — Nancy R Johnson
(74) *Attorney, Agent, or Firm* — Baker Botts L.L.P.

(57) ABSTRACT

Methods for manufacturing a multilayer composite display cover include stacking a plurality of composite layers, each comprising an ultra-thin glass sheet covered in a polymer layer. After a cover glass sheet is placed on an exposed polymer layer, the composite layers may be bonded together. A ceramic coating may be applied to the external surfaces to increase hardness.

15 Claims, 3 Drawing Sheets

(56) References Cited

U.S. PATENT DOCUMENTS

| | | |
|---|---|---|
| 2009/0280709 A1* | 11/2009 | Rukavina ............ B32B 17/1077 |
| | | 442/394 |
| 2010/0035038 A1* | 2/2010 | Barefoot ................ C03C 3/064 |
| | | 428/220 |
| 2010/0277443 A1* | 11/2010 | Yamazaki ............. G06F 1/1616 |
| | | 345/204 |
| 2010/0302473 A1 | 12/2010 | Poveda |
| 2011/0003142 A1 | 1/2011 | Asuka |
| 2011/0245640 A1 | 10/2011 | MacLaughlin |
| 2012/0058320 A1 | 3/2012 | Kishimoto et al. |
| 2013/0083506 A1* | 4/2013 | Wright ................ H04M 1/0202 |
| | | 361/807 |
| 2013/0147330 A1 | 6/2013 | DiFonzo |
| 2013/0182328 A1* | 7/2013 | Stewart ................. G02B 1/118 |
| | | 359/580 |
| 2013/0323444 A1* | 12/2013 | Ehemann ............. C03C 21/002 |
| | | 428/34.4 |
| 2015/0202845 A1* | 7/2015 | Cherekdjian ..... B32B 17/10137 |
| | | 428/215 |
| 2016/0009068 A1* | 1/2016 | Garner ................ B32B 38/0012 |
| | | 156/196 |

* cited by examiner

300 — METHOD OF MANUFACTURING A MULTILAYER COMPOSITE DISPLAY COVER

APPLY A POLYMER COATING TO AN ULTRA-THIN GLASS SHEET THAT CORRESPONDS IN SIZE TO A DISPLAY COVER TO FORM A COMPOSITE LAYER — 302

STACK A PLURALITY OF THE COMPOSITE LAYERS SEQUENTIALLY — 304

STACK AN ULTRA-THIN GLASS COVER SHEET OVER AN EXPOSED POLYMER COATING OF THE COMPOSITE LAYERS — 306

BOND THE STACKED COMPOSITE LAYERS TOGETHER TO FORM THE MULITLAYER COMPOSITE DISPLAY — 308

VAPOR DEPOSIT A CERAMIC COATING OVER AT LEAST ONE EXTERNAL ULTRA-THIN GLASS SHEET AT AN EXTERIOR SURFACE OF THE MULTILAYER COMPOSITE DISPLAY COVER — 310

FIG. 3

MULTILAYER GLASS COMPOSITE DISPLAY COVER

BACKGROUND

Field of the Disclosure

This disclosure relates generally to information handling systems and, more particularly, to a multilayer glass composite display cover for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Advancements in packaging design have reduced both the weight and thickness of information handling systems. In particular, components included in displays of portable information handling systems, such as laptops, notebooks, and tablet form factors, are the object of efforts to reduce weight and thickness, without compromising structural strength. Specifically, display covers are rapidly becoming a primary interface between a user and a portable information handling system. Often referred to as a 'cover glass' because of the glass base material used, display covers are also subject to optical performance attributes, such as supporting high resolution displays, high brightness, excellent color reproduction, as well as supporting touch functionality.

As overall weight of portable information handling systems decreases, the weight contribution of display covers made of glass has come under increased scrutiny by product designers. Although reducing the thickness of a display cover made of glass will reduce weight, an undesirable reduction in structural rigidity may also occur with thinner display covers. Additionally, newer designs of information handling systems involving integration of various user interface elements are appearing and are affecting display cover performance. Display covers may now include features such as color bezels, protrusions, holes, or other mounting structures for buttons or other electronic devices, such as cameras and microphones. Such features may introduce localized stress concentrations that may lead to undesirable early failure of display covers, often in the form of cracks or fractures.

Accordingly, it is desirable to have an improved design and a correspondingly improved manufacturing method for display covers in an information handling system that yields lightweight yet sufficiently robust display covers.

SUMMARY

In one aspect, a disclosed method is for manufacturing a multilayer composite display cover for use in an information handling system. The method may include applying a polymer coating to an ultra-thin glass sheet that corresponds in size to a display cover to form a composite layer. The method may also include stacking a plurality of the composite layers sequentially, including stacking an ultra-thin glass cover sheet over an exposed polymer coating of the composite layers. The method may further include bonding the stacked composite layers together to form the multilayer composite display cover. In any of the disclosed embodiments, the method may include vapor depositing a ceramic coating over at least one external ultra-thin glass sheet at an exterior surface of the multilayer composite display cover. The ceramic coating may be selected from at least one of: sapphire ($Al_2O_3$), aluminium oxynitride (AlON), yttrium aluminium garnet (YAG), zircon ($ZrSiO_4$), cubic zirconia ($ZrO_2$), and spinel ($MgAl_2O_4$).

Other disclosed aspects include a multilayer composite display cover for use in an information handling system, a display having the multilayer composite display cover, and an information handling system including a display having the multilayer composite display cover.

BRIEF DESCRIPTION OF THE DRAWINGS

For a more complete understanding of the present invention and its features and advantages, reference is now made to the following description, taken in conjunction with the accompanying drawings, in which:

FIG. 3 is a flowchart depicting selected elements of an embodiment of a method for manufacturing a multilayer composite display cover for use in an information handling system.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU)

or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

As noted previously, current information handling systems may demand ever thinner and lighter products, without sacrificing strength and stability. In particular, thinner displays are being developed for portable information handling systems that include a display cover. As will be described in further detail, the inventors of the present disclosure have developed novel methods and structures disclosed herein for manufacturing a multilayer composite display cover comprised of alternating layers of ionic exchange-strengthened ultra-thin glass sheets and a polymer layer. The disclosed multilayer composite display cover is thin and lightweight, while meeting expectations for durability and high quality.

Figure 1:
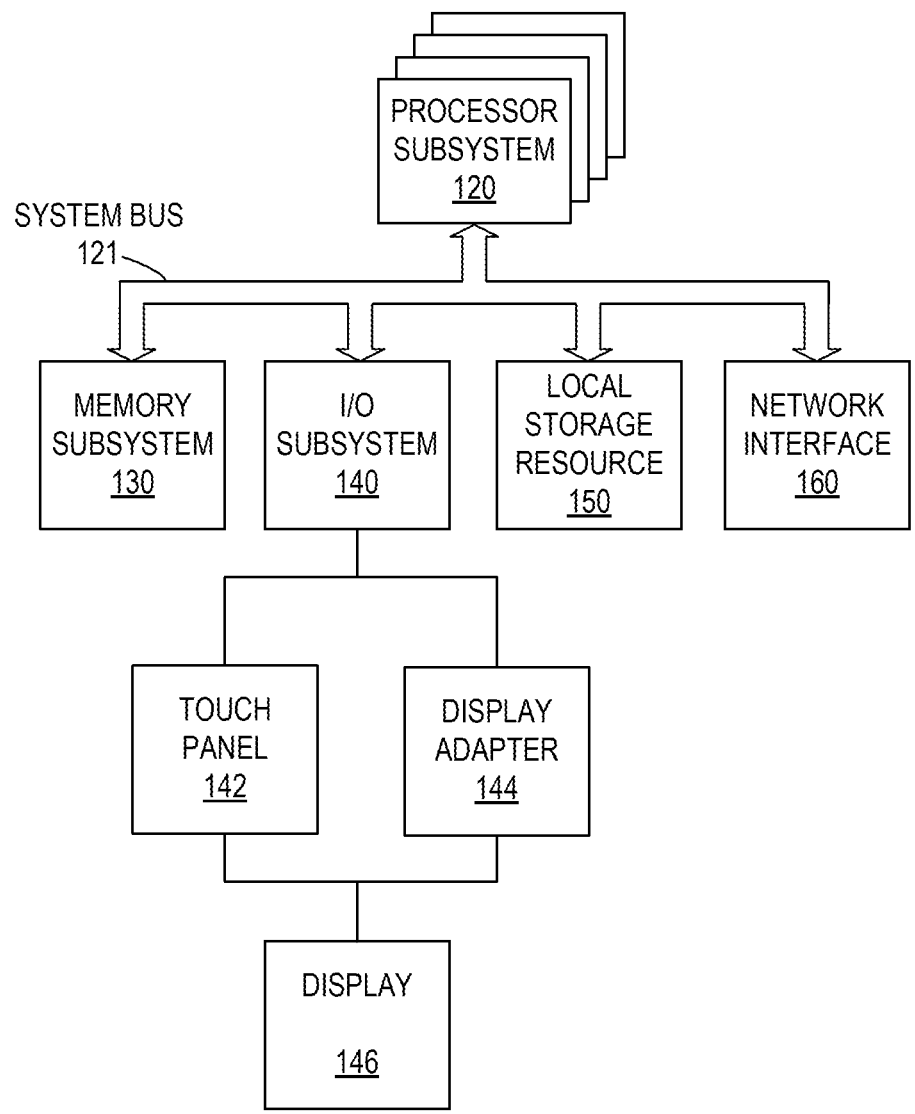
FIG. 1 is a block diagram of selected elements of an embodiment of an information handling system.
Figure 2:
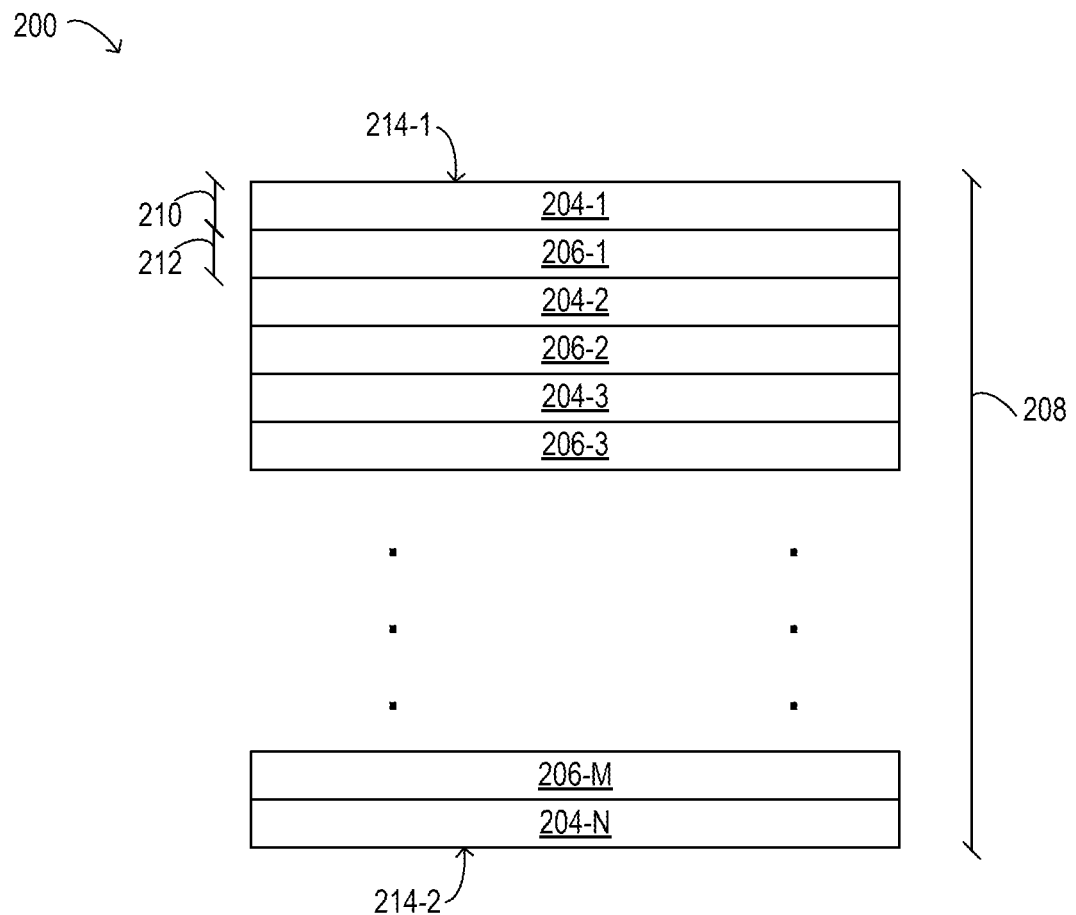
FIG. 2 is a block diagram of selected elements of an embodiment of a multilayer composite display cover.

Particular embodiments are best understood by reference to FIGS. 1, 2, and 3 wherein like numbers are used to indicate like and corresponding parts.

Turning now to the drawings, FIG. 1 illustrates a block diagram depicting selected elements of an embodiment of information handling system 100. As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, network storage resource 170 may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144. As shown, display 146 may include a multilayer composite display cover, as described herein.

Turning now to FIG. 2, selected elements of an embodiment of multilayer composite display cover 200 are illustrated. As shown, multilayer composite display cover 200 may represent various embodiments of multilayer composite display covers described herein and is shown in cross-section for descriptive clarity. Multilayer composite display cover 200 includes alternating layers of ultra-thin glass sheet 204 and polymer layer 206. The layers of ultra-thin glass sheet 204 may be cut to a size desirable for a display cover. In particular, multilayer composite display cover 200 may be well suited for compact portable information handling systems, for example having a diagonal size of about 7 inches or greater.

In FIG. 2, multilayer composite display cover 200 may include a plurality of composite layers, such as ultra-thin glass sheet 204-1 and polymer layer 206-1, which may be successively stacked. Accordingly, a second composite layer may be represented by ultra-thin glass sheet 204-2 and polymer layer 206-3, a third composite layer may be represented by ultra-thin glass sheet 204-3 and polymer layer 206-3, and so on, up to M number of composite layers that end with polymer layer 206-M. Since polymer layer 206-M may not be suitable as an external surface layer for a display cover, ultra-thin glass cover sheet 204-N may be added at an external surface of multilayer composite display cover 200. Thus, multilayer composite display cover 200 may comprise M number of polymer layers 206 and N number of ultra-thin glass sheets 204, where N=M+1. In various embodiments, M may have a value in the range of 5-50. An overall thickness 208 of multilayer composite display cover 200 may be at least 100 microns thick and may be about 200 microns thick in particular embodiments. A thickness 210 of ultra-thin glass sheet 204 may be at least 10 microns thick and a thickness 212 of polymer layer 206 may be at least 10 microns thick. In various embodiments, the composite layers are substantially each of uniform thickness. In some embodiments, varying thicknesses, or individual composite layers having larger thicknesses than other composite layers, may be used.

A material composition of ultra-thin glass sheets 204 may include ionic exchange-strengthened glass, for example, using potassium or other large ions. Additionally, ultra-thin glass sheets 204 may be vapor deposited with rare earth metals and then annealed at high temperature to diffuse the rare earth metals and oxidize the glass, whereby high strength is achieved. In some embodiments, at least certain ones of ultra-thin glass sheets 204 in multilayer composite display cover 200 may be replaced with a crystalline ceramic material, such as aluminium oxynitride (AlON), yttrium aluminium garnet (YAG), zircon (ZrSiO$_4$), cubic zirconia (ZrO$_2$), spinel (MgAl$_2$O$_4$), among others. In various embodiments, ultra-thin glass sheets 204 may be highly strong and flexible, while retaining excellent optical properties, such as high transparency in the visible light region of the optical spectrum.

A material composition of polymer layers 206 may include at least one of: polyurethane (PU), polyetherimide (PEI), impact-modified poly(methyl methacrylate) (PMMA), polycarbonate (PC), polyvinylpyrrolidine (PVP), and glycol-modified polyethylene terephthalate (PET-G). For example, to obtain desired anti-fog properties, polyvinylpyrrolidine may be used. In other example, to obtain improvement of adhesion to zirconia, glycol-modified polyethylene terephthalate may be used. The polyurethane polymer may be diffused with particulate or filler, such as silica fiber, silica particles, ceramic fiber, or ceramic particles. In various embodiments, a nanoceramic solgel may also be included with polymer layer 206. The nanoceramic solgel may include alumina, silica, or zirconia. It is noted that a material composition of polymer layers 206 may be selected to achieve a desired physical property, such as stiffness or toughness, of multilayer composite display cover 200.

A hardness of ultra-thin glass sheets 204 may be about 5-6 H, where H is a hardness value according to the Mohs scale of mineral hardness. In certain applications, where a higher surface hardness of about 9-10 H is desired on at least one of external surfaces 214-1 and 214-2, a ceramic layer may be coated over ultra-thin glass sheet 204-1 or ultra-thin glass sheet 204-N. The ceramic layer may be vapor deposited. A material composition of the ceramic layer may include a crystalline ceramic material, such as sapphire (Al$_2$O$_3$), aluminium oxynitride (AlON), yttrium aluminium garnet (YAG), zircon (ZrSiO$_4$), cubic zirconia (ZrO$_2$), spinel (MgAl$_2$O$_4$), among others.

Manufacture of multilayer composite display cover 200 may involve different steps, in particular embodiments. First, N number of ultra-thin glass sheets 204 may be cut to a desired size for a display cover. Then, polymer layer 206 may be applied to M number of ultra-thin glass sheets 204 to form M number of composite layers. The composite layers may be stacked successively, such that ultra-thin glass sheets 204 and polymer layers 206 alternate. Then, a final ultra-thin glass cover sheet 204-N may be added to the stack. The entire stack may then be bonded together to form multilayer composite display cover 200. The bonding may involve heat pressing the entire stack. As noted previously, a ceramic coating may be applied, either prior to stacking or after bonding, to at least one of external surfaces 214-1 and 214-2.

Referring now to FIG. 3, a block diagram of selected elements of an embodiment of method 300 for manufacturing a multilayer composite display cover for use in an information handling system (such as information handling systems 100) is depicted in flowchart form. It is noted that certain operations described in method 300 may be optional or may be rearranged in different embodiments.

Method 300 may begin by applying (operation 302) a polymer coating to an ultra-thin glass sheet that corresponds in size to a display cover to form a composite layer. A plurality of the composite layers may be stacked (operation 304) sequentially. The stack may be aligned to the overall size of the desired display cover. An ultra-thin glass cover sheet may be stacked (operation 306) over an exposed polymer coating of the composite layers. The stacked composite layers may be bonded together (operation 308) to form the multilayer composite display. A ceramic coating may be vapor deposited (operation 310) over at least one external ultra-thin glass sheet at an exterior surface of the multilayer composite display cover. The ceramic coating may be selected from at least one of: sapphire (Al$_2$O$_3$), aluminium oxynitride (AlON), yttrium aluminium garnet (YAG), zircon (ZrSiO$_4$), cubic zirconia (ZrO$_2$), and spinel (MgAl$_2$O$_4$). It is noted that, in certain embodiments, operation 310 may be performed prior to operation 302 on external glass cover sheet surfaces used in method 300.

As disclosed herein, methods for manufacturing a multilayer composite display cover include stacking a plurality of composite layers, each comprising an ultra-thin glass sheet covered in a polymer layer. After a cover glass sheet is placed on an exposed polymer layer, the composite layers may be bonded together. A ceramic coating may be applied to the external surfaces to increase hardness.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A multilayer composite display cover for use in an information handling system, comprising:
 a plurality of composite layers each corresponding in size to a display cover, the plurality of composite layers sequentially bonded together, each of the plurality of composite layers comprising a polymer coating over an ultra-thin glass sheet;
 an ultra-thin glass cover sheet bonded to an exposed polymer coating of the plurality of composite layers;
 a ceramic layer coating the ultra-thin glass cover sheet, the ceramic layer comprised of a crystalline ceramic material vapor deposited to the ultra-thin glass cover sheet, the crystalline ceramic material including zircon ($ZrSiO_4$); and
 wherein an overall thickness of the multilayer composite display cover is between 100 microns and 200 microns.

2. The multilayer composite display cover of claim 1, wherein the plurality of the composite layers is at least 25 layers.

3. The multilayer composite display cover of claim 1, wherein the composite layers have the same thickness as each other.

4. The multilayer composite display cover of claim 1, wherein the composite layers comprise at least 50 microns of the ultra-thin glass sheet.

5. The multilayer composite display cover of claim 1, wherein the composite layers comprise at least 50 microns of the polymer coating.

6. The multilayer composite display cover of claim 1, wherein the ultra-thin glass sheet is comprised of ionic exchange-strengthened glass.

7. The multilayer composite display cover of claim 1, wherein the polymer coating includes glycol-modified polyethylene terephthalate (PET-G).

8. The multilayer composite display cover of claim 1, wherein the polymer coating includes silica nanogel.

9. The multilayer composite display cover of claim 1, wherein the polymer coating includes at least one of: polyetherimide (PEI), impact-modified poly(methyl methacrylate) (PMMA), polycarbonate (PC), polyvinylpyrrolidine (PVP), and glycol-modified polyethylene terephthalate (PET-G).

10. The multilayer composite display cover of claim 9, wherein the polymer coating is diffused with at least one of silica particles and ceramic particles.

11. The multilayer composite display cover of claim 9, wherein the polymer coating includes a nanoceramic solgel.

12. The multilayer composite display cover of claim 11, wherein the nanoceramic solgel includes alumina, silica, or zirconia.

13. The multilayer composite display cover of claim 1, wherein at least one ultra-thin glass sheet of the plurality of composite layers includes rare earth metals.

14. The multilayer composite display cover of claim 13, wherein the at least one ultra-thin glass sheet of the plurality of composite layers, which includes the rare earth metals, includes the ultra-thin glass cover sheet bonded to the exposed polymer coating of the plurality of composite layers.

15. The multilayer composite display cover of claim 1, wherein the multilayer composite display cover has a diagonal size of at least seven inches.

* * * * *